United States Patent

Perrott

(10) Patent No.: US 11,955,993 B2
(45) Date of Patent: Apr. 9, 2024

(54) LOW POWER ALWAYS-ON MICROPHONE USING POWER REDUCTION TECHNIQUES

(71) Applicant: INVENSENSE, INC., San Jose, CA (US)

(72) Inventor: Michael Perrott, Nashua, NH (US)

(73) Assignee: INVENSENSE, INC., San Jose, CA (US)

( * ) Notice: Subject to any disclaimer, the term of this patent is extended or adjusted under 35 U.S.C. 154(b) by 706 days.

(21) Appl. No.: 17/114,087

(22) Filed: Dec. 7, 2020

(65) Prior Publication Data

US 2021/0091785 A1 Mar. 25, 2021

Related U.S. Application Data

(63) Continuation of application No. 16/541,869, filed on Aug. 15, 2019, now Pat. No. 10,892,772.

(Continued)

(51) Int. Cl.
*H03M 3/00* (2006.01)
*G06F 1/3234* (2019.01)
(Continued)

(52) U.S. Cl.
CPC ........... *H03M 3/416* (2013.01); *G06F 1/324* (2013.01); *G06F 1/325* (2013.01); *H03M 3/33* (2013.01);
(Continued)

(58) Field of Classification Search
CPC .......... H04R 17/02; H04R 19/04; H04R 3/00; H04R 2499/11; H04R 1/04; G06F 1/325;
(Continued)

(56) References Cited

U.S. PATENT DOCUMENTS 5,666,384 A 9/1997 Kuran et al.
8,103,027 B2 1/2012 Zhang et al.
(Continued)

FOREIGN PATENT DOCUMENTS

WO 2018/060584 A1 4/2018

OTHER PUBLICATIONS

International Preliminary Report on Patentability received for PCT Application Serial No. PCT/US2019/046810 dated Mar. 4, 2021, 10 pages.

(Continued)

*Primary Examiner* — Carolyn R Edwards
*Assistant Examiner* — Julie X Dang
(74) *Attorney, Agent, or Firm* — Amin, Turocy & Watson, LLP

(57) ABSTRACT

An audio activity detector device is disclosed. The audio activity detector device comprises a closed loop feedback regulating circuit that supplies an input signal representative of a time-varying voltage signal to a quantizer circuit, wherein the quantizer circuit, as a function of the input signal, converts the input signal to a quantizer discrete-time signal; a first circuit that, as a function of the discrete-time signal, determines a key quantizer statistic value for the quantizer discrete-time signal; and a second circuit that, as a function of the key quantizer statistic value, determines a signal statistic value for the input signal and a gain control value.

18 Claims, 5 Drawing Sheets

Related U.S. Application Data

(60) Provisional application No. 62/765,086, filed on Aug. 17, 2018.

(51) Int. Cl.
  *G06F 1/324* (2019.01)
  *H04R 17/02* (2006.01)
  *H04W 52/02* (2009.01)

(52) U.S. Cl.
  CPC ........ H04R 17/02 (2013.01); H04W 52/0251 (2013.01)

(58) Field of Classification Search
  CPC ........ G06F 1/324; G06F 1/3206; H03M 3/33; H03M 3/416; H04W 52/0251; Y02D 10/00; Y02D 30/70; G10L 25/84
  See application file for complete search history.

(56) References Cited

U.S. PATENT DOCUMENTS

| | | | |
|---|---|---|---|
| 8,447,057 B2 | 5/2013 | Goida et al. | |
| 9,428,379 B2 | 8/2016 | Ata et al. | |
| 9,478,234 B1 | 10/2016 | Nandy et al. | |
| 9,712,923 B2 | 7/2017 | Fürst et al. | |
| 10,366,699 B1* | 7/2019 | Dharia | G10L 25/21 |
| 2005/0172158 A1* | 8/2005 | Mcclendon | G06F 1/324 |
| | | | 713/300 |
| 2009/0204409 A1* | 8/2009 | Mozer | G10L 15/30 |
| | | | 704/275 |
| 2010/0103003 A1 | 4/2010 | Deval et al. | |
| 2011/0251845 A1* | 10/2011 | Arakawa | G10L 25/78 |
| | | | 704/E21.001 |
| 2012/0026861 A1* | 2/2012 | Maeda | H04L 27/26532 |
| | | | 370/208 |
| 2015/0066498 A1 | 3/2015 | Ma et al. | |
| 2015/0112689 A1 | 4/2015 | Nandy et al. | |
| 2015/0221307 A1 | 8/2015 | Shah et al. | |
| 2015/0358730 A1* | 12/2015 | Kirsch | H04R 3/002 |
| | | | 381/71.1 |
| 2016/0314805 A1 | 10/2016 | Mortazavi et al. | |

OTHER PUBLICATIONS

International Search Report and Written Opinion received for PCT Application Serial No. PCT/US2019/046810 dated Oct. 29, 2019, 16 pages.

Notice of Allowance received for U.S. Appl. No. 16/541,869 dated Sep. 8, 2020, 32 pages.

\* cited by examiner

LOW POWER ALWAYS-ON MICROPHONE USING POWER REDUCTION TECHNIQUES

CROSS REFERENCE TO RELATED APPLICATIONS

This application is a continuation of, and claims priority to, U.S. patent application Ser. No. 16/541,869, titled: "LOW POWER ALWAYS-ON MICROPHONE USING POWER REDUCTION TECHNIQUES," filed Aug. 15, 2019, which claims priority to U.S. Provisional Patent Application Ser. No. 62/765,086, titled: "LOW POWER ALWAYS-ON MICROPHONE USING POWER REDUCTION TECHNIQUES," filed Aug. 17, 2018, the disclosure of which is hereby incorporated herein by reference in its entirety.

TECHNICAL FIELD

The subject disclosure relates to an ultra low power consumption digital microphone that is in an always-on state through use of methods by which sensor power is gated according to audio activity.

BACKGROUND

Currently, in order to achieve low power operation of a sensor device/circuit, such as a microphone device/circuit, in low power mode (LPM) reliance has typically been placed on pure current optimization techniques rather than on audio activity detection.

SUMMARY

The following presents a simplified summary of the specification to provide a basic understanding of some aspects of the specification. This summary is not an extensive overview of the specification. It is intended to neither identify key or critical elements of the specification nor delineate any scope particular to any embodiments of the specification, or any scope of the claims. Its sole purpose is to present some concepts of the specification in a simplified form as a prelude to the more detailed description that is presented later.

In accordance with various embodiments, the subject application discloses an audio activity detector device comprising a closed loop feedback regulating circuit, such as an automatic gain control (AGC) circuit, that supplies an input signal representative of a time-varying voltage signal to a quantizer circuit, wherein the quantizer circuit, as a function of the input signal, converts the input signal to a quantizer discrete-time signal; a first circuit that, as a function of the discrete-time signal, determines a key quantizer statistic value for the quantizer discrete-time signal; and a second circuit that, as a function of the key quantizer statistic value, determines a signal statistic value for the input signal and a gain control value.

The key quantizer static value can represent one or more of a root mean square value, a standard deviation value, a peak-to-peak value, an instantaneous amplitude value, an average value, a modal value, a median value, and/or the input signal.

In accordance with the foregoing, the first circuit can determine the key quantizer statistic value based on the discrete-time signal and a system clock value, and the second circuit can determine the signal statistic value and the gain control value based on the key quantizer statistic value and a system clock value. The gain control value typically can be supplied to the closed loop feedback regulating circuit. Additionally, where the input signal is a first input signal, the closed loop feedback regulating circuit can receive a second input signal representative of an unregulated signal of varying signal amplitudes. Further, in some embodiments the quantizer circuit can be a multi-bit quantizer circuit. Further, in additional embodiments, the gain control value can be dithered using delta-sigma dithering.

In accordance with further embodiments set forth herein, a method is disclosed. The method can comprise converting, by a device comprising an electronic circuit, a time-varying voltage signal to a discrete-time signal; determining, by the device, a quantizer statistic value based on the discrete-time signal; and determining, by the device, a signal statistic value for the time-varying voltage signal as a function of the quantizer statistic value and a gain control value as a function of the quantizer statistic value. Additionally, the method can also include determining, by the device, the quantizer statistic value as a function of the discrete-time signal and a clock signal value, and determining, by the device, the signal statistic value and the gain control value as a function of the quantizer statistic value and a clock signal value. In accordance with disparate embodiments the electronic circuit can be a multi-bit quantizer circuit, and the quantizer statistic value can represent an instantaneous amplitude value.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

The numerous aspects, embodiments, objects and advantages of the present disclosure will be apparent upon consideration of the following detailed description, taken in conjunction with the accompanying drawings, in which like reference characters refer to like parts throughout, and in which.

DETAILED DESCRIPTION

Figure 1:
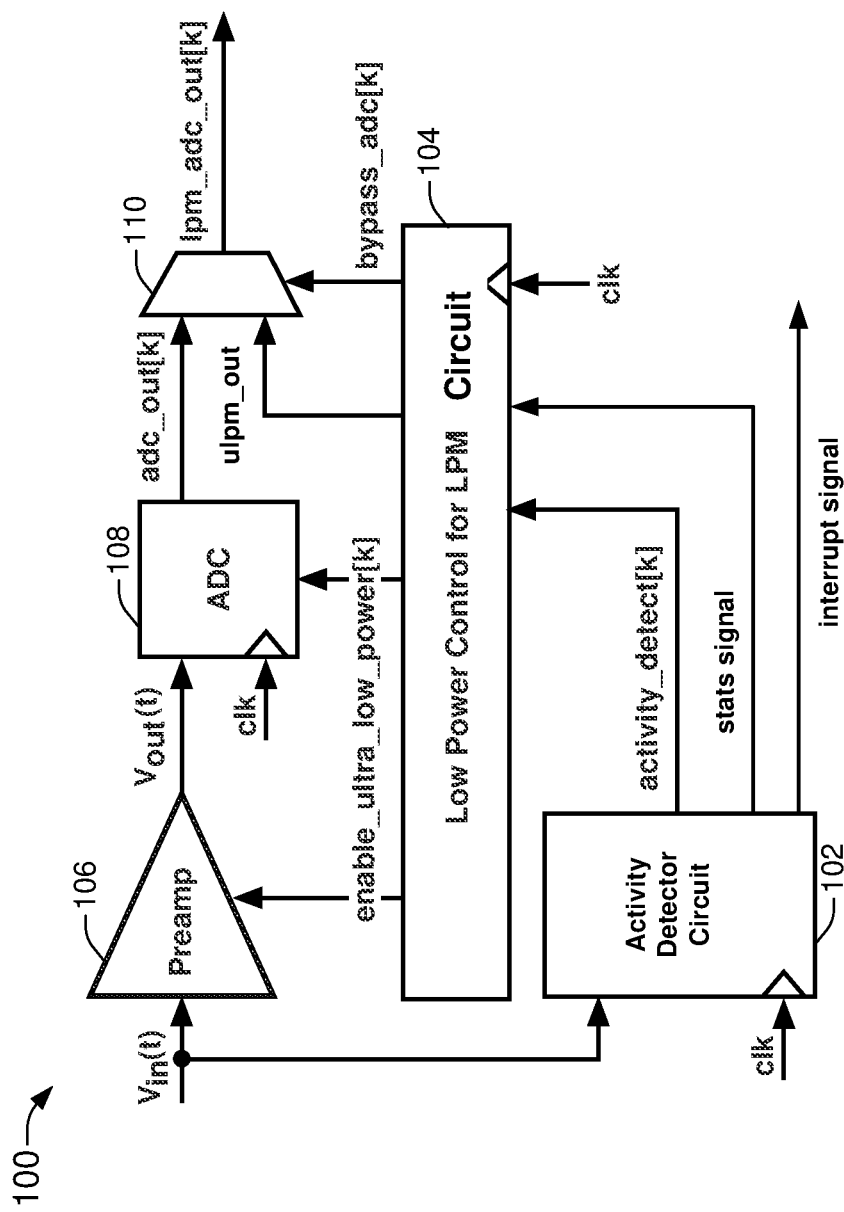
FIG. 1 illustrates an audio activity detector device/circuit in accordance with various embodiments set forth in this disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It may be evident, however, that the various embodiments can be practiced without these specific details, e.g., without applying to any particular networked environment or standard. In other instances, well-known structures and devices are shown in block diagram form in order to facilitate describing the embodiments in additional detail.

The subject application discloses and describes a sensor device/circuit, such as a digital microphone device/circuit, that is in an always-on state while utilizing ultra low (or very low) power consumption. The sensor device/circuit accomplishes using very low power consumption while being in an always-on state by using methods by which sensor power consumption is gated based on detected audio activity.

Generally keyword detection and other voice activated applications rely on always-on operation of a microphone circuit/device in order to continuously monitor audio activity. In such applications, the overall system power is typically in a low power state until a significant audio event occurs. In response to detecting a significant audio event the system transitions from the low power state (e.g., a first power state) to a higher power state (e.g., a second power state). When the system is in a low power state it generally is important to ensure that the microphone circuit/device is utilizing a minimal amount of power while still preserving the capability to detect audio activity. For digital microphones, this involves putting the microphone into a Low Power Mode (LPM) in which the clock frequency to the microphone is lowered in frequency compared to High Quality Mode (HQM) operation and the circuits are optimized for low power operation by taking advantage of a reduced bandwidth requirement (e.g., 8 kiloHertz (kHz) rather than in excess of 20 kHz as often assumed in HQM).

The subject disclosure describes, in accordance with various embodiments, a sensor device/circuit that provides techniques to further lower the LPM microphone power by taking advantage of the fact that the microphone output need not be an accurate representation of the input audio signal during times that insignificant audio activity occurs.

As noted earlier, current methods to achieve low power operation of digital microphone sensor circuits in LPM rely on pure circuit optimization that is generally not dependent on audio activity detection. Thus, the subject disclosure provides an activity monitor device (or sensor device) that monitors the input audio signal in order to detect ambient audio activity versus non-ambient audio activity. In order to facilitate determining ambient versus non-ambient audio conditions in a variety of disparate audio environments, a root mean square (RMS) signal energy (or other appropriate signal statistics), for instance, can be continuously calculated and/or determined and thereafter appropriate averaging functionalities can be applied to determine the ambient audio signal statistics in an adaptable manner (e.g., responsive to changes in audio environment). The threshold for detecting ambient versus non-ambient audio activity can be dynamically adjusted according to the ambient statistics to facilitate and/or achieve low False Acceptance Ratios (FAR) and/or False Rejection Ratios (FRR). During times of ambient audio activity (e.g., during times of determined white noise, background noise, etc.), the microphone sensor circuits can be placed in a reduced power state that can be designed such that fast wake-up can occur for the microphone sensor circuit. Several methods are contemplated and can be employed to achieve this reduced power state, including duty cycling (e.g., to keep sensor circuit refreshed in terms of its state while saving power) and/or reduction of bias currents and/or reduction in supply voltages. During this time of ambient audio activity, the microphone output can be set to a "zero signal," "ulpm_out," or a "control signal" which can correspond to an appropriate bit-stream sequence to indicate lack of audio activity. When non-ambient activity is detected, the microphone sensor circuits can rapidly be placed into service such that the microphone output becomes representative of the input audio signal.

In concert with the foregoing and in accordance with various embodiments, the audio activity detector comprises an amplifier, a quantizer, and digital signal processing to determine, for example, key signal statistics of a signal that is input to the audio activity detector. The key signal statistics can be determined or calculated over a defined or determinable time interval to achieve an accurate estimate of the signal statistic while also achieving a fast response for the activity detect output.

FIG. 1 illustrates an audio activity detector device 100 in accordance with one or more various embodiments. As illustrated, the audio activity detector device 100, in accordance with various embodiments and/or aspects, can comprise activity detector circuit 102 that can be electrically and/or communicatively coupled to low power control for low power mode (LPM) circuit 104. Low power control for LPM circuit 104 (also referred to as low power control for LPM path 104) can in turn be electrically and/or communicatively coupled respectively to preamplifier circuit 106, analog to digital conversion (ADC) circuit 108, and multiplexer circuit 110. It should be noted without limitation or loss of generality that multiplexer circuit 110 can be optional in some disclosed embodiments provided ADC circuit 108 can be configured to output a distinguishable defined or definable signal pattern indicative of a lack of attributable activity (e.g., ambient noise activity)

Activity detector circuit 102 can receive as input a signal (e.g., $V_{in}(t)$) and data that represents a clock input (e.g., clk) value that can have been generated/determined by a system clock (not shown). The activity detector circuit 102, as a function of the input signal and/or the clock input can output data representative of a activity detect signal (e.g., activity_detect[k]). The data representative of the activity detect signal, determined and generated by activity detector circuit 102, can be communicated to low power control for LPM circuit 104 together with data representing a clock input (e.g., clk) value that can also have been generated/determined by the system clock. Further, activity detector circuit 102 can also output a statistical signal (e.g., stats signal) and/or an interrupt signal (e.g., interrupt).

Low power control for LPM circuit 104, in response to receiving data representing the activity detect signal, data representing a clock input value and/or the statistical signal conveyed by activity detector circuit 102, can as a function of each of these respective signal (e.g., singularly and/or in combination with one another) can respectively determine and/or respectively output data that: (a) represents an enable ultra low power signal (e.g., enable_ultra_low_power[k]), (b) data representing a ultra low power out signal (e.g., ulpm_out signal), and/or (c) a bypass adc signal (e.g., bypass_adc[k]). In accordance with various embodiments, the ultra low power out signal can correspond to a digital bit sequence that represents no significant signal being present. The data representing the enable ultra low power signal can be forwarded to preamplifier circuit 106 and/or ADC circuit 108, the data representing the ultra low power out signal and/or the data representing the bypass adc signal can be conveyed to multiplexer circuit 110. In certain embodiments, an output of activity detector circuit 102 can be used as an interrupt signal. Additionally and/or alternatively, the ultra low power out signal can comprise statistical data such as RMS values, such as when the activity level detected by activity detect circuit 102 is negligible (e.g., approaches zero (0) and/or is zero (0)).

As also depicted, preamplifier circuit 106 can receive as input the same (or similar) input signal (e.g., $V_{in}(t)$) that is also supplied to activity detector circuit 102. Preamplifier circuit 106, in response to receiving the input signal (e.g., $V_{in}(t)$) and data representative of the enable ultra low power signal (e.g., from low power control for LPM circuit 104), as a function of the input signal and the data representative of the enable ultra low power signal can generate data representing a preamplifier output signal (e.g., $V_{out}(t)$). The data representing the preamplifier output signal can be forward to ADC circuit 108 for further processing. ADC circuit 108 in response to receiving data representing the preamplifier output (e.g., $V_{out}(t)$), data representing the enable ultra low power signal (e.g., received from low power control for LPM circuit 104), and/or data representing a clock input (e.g., clk) value can generate data representative of an adc output signal (e.g., adc_out[k]) that can then be forwarded to multiplexer circuit 110 for additional processing.

Multiplexer circuit 110, in response to receiving data representing the adc output signal, data representative of a ulpm_out signal (e.g., from low power control for LPM circuit 104), and/or data representing a bypass adc signal (e.g., also from low power control for LPM circuit 104), can generate a low power mode analog to digital conversion output signal (e.g., lpm_adc_out[k]).

In accordance with the foregoing, the various circuitry that comprises audio activity detector device 100 can facilitate low power control for LPM circuit 104 to transition from a first state (off state) to a second state (on state) when the input signal (e.g., $V_{in}(t)$) is "interesting" (e.g., when non-ambient noise is detected) The audio activity detector device 100 can utilize the functionalities and facilities comprising at least activity detector circuit 102 to facilitate low power control for LPM circuit 104 to transition from a first state to a second state. Additionally, the facilities and functionalities provided by activity detector circuit 102 can also be used to facilitate low power control for LPM circuit 104 to transition from a second state to a third state.

In accordance with foregoing embodiments, the first state can be a ultra low power state (ultra low power mode (ULPM), the second state can be a low power state (low power mode (LPM), and the third state can be a high power state (high quality mode (HQM)). It should be noted that in accordance with various embodiments, that activity detect circuit 102 can rapidly facilitate (via use of low power control for LPM circuit 104) transition directly from a first state (e.g., ultra low quality mode/ultra low power state) to a second state (e.g., high power state/high quality mode) without the necessity of transitioning through an intermediary state (e.g., the low power state/low quality mode). Conversely, in accordance with additional disparate embodiments, activity detector circuit 102 can facilitate state transitions directly from a high power state/high quality mode to a ultra low quality mode/ultra low power state; or indirectly from a high power state/high quality mode to a ultra low quality mode/ultra low power state via a low power state/low quality mode.

Generally, activity detector circuit 102 can facilitate low power control for LPM circuit 104 to place audio activity detector device 100 into a ultra low power mode in response to activity detector circuit 102 determining that the input signal (e.g., $V_{in}(t)$) is representative of ambient noise (e.g., background noise, white noise, and the like). Nevertheless, when activity detector circuit 102 detects that that the input signal is no longer ambient noise (e.g., non-ambient noise) activity detector circuit 102 can facilitate low power control for LPM circuit 104 to transition from, for example, one or more of: a ultra low power mode to a low power mode; from a ultra low power mode to a high power mode; and/or from a low power mode to a high power mode. In order to achieve these rapid transitions, from ultra low power mode to low power mode; from ultra low power mode to high power mode; and/or from low power mode to high power mode, activity detector circuit 102 in collaboration with low power control for LPM circuit 104 can employ duty cycling (refresh), reduction of bias currents, reduction of voltages, and the like to achieve ultra low power operation of audio activity detection device 100.

Figure 2:
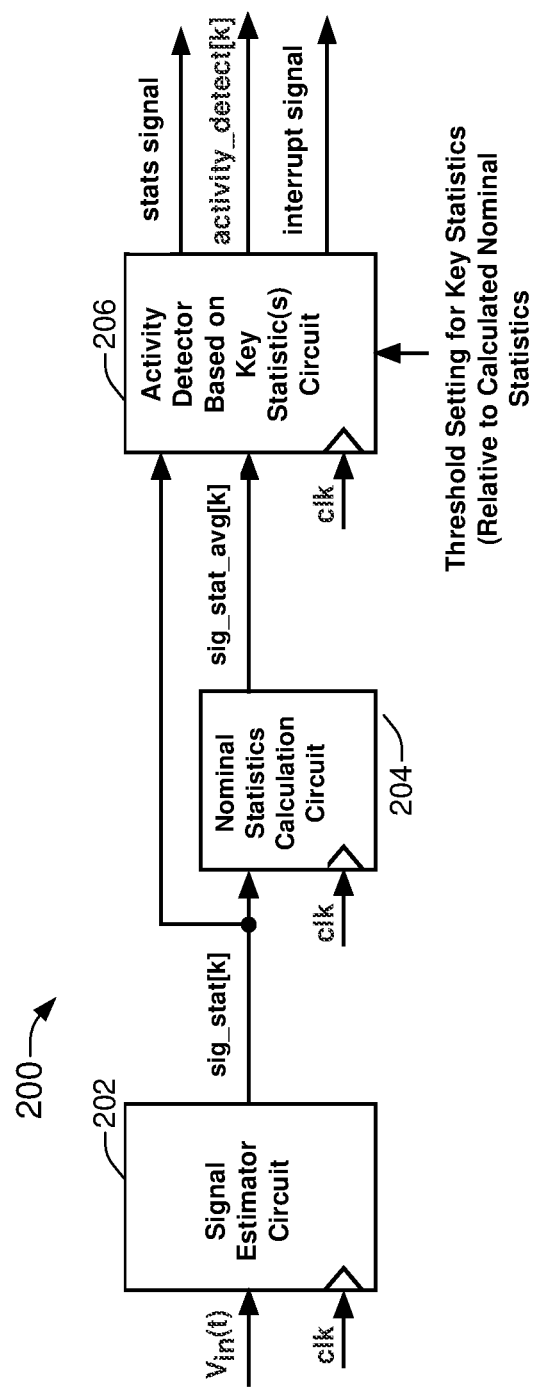
FIG. 2 illustrates aspects of an audio activity detector device/circuit in accordance with various embodiments set forth herein.

FIG. 2 provides additional illustration 200 of aspects pertaining to activity detector circuit 102, in accordance with additional various embodiments. As depicted, activity detector circuit 102 can comprise signal estimator circuit 202, nominal statistic determination (calculation) circuit 204, and/or activity detector based on key statistic(s) circuit 206. In accordance with various embodiments signal estimator circuit 202 can receive the input signal (e.g., $V_{in}(t)$) together with a system generated clock signal (clk) value. Signal estimator circuit 202 based on the input signal and/or the generated clock signal (e.g., generated by a system clock (not shown) can generate and output a statistic signal (e.g., sig_stat[k]). The statistic signal can then be communicated to nominal statistic determination (calculation) circuit 204 and/or activity detector based on key statistic(s) circuit 206.

Nominal statistic determination (calculation) circuit 204, in response to receiving the statistic signal and/or a further generated clock signal (clk) value, can generate an average statistic signal (e.g., sig_stat_avg[k]) that can be conveyed to activity detector based on key statistic(s) circuit 206. Activity detector based on key statistic(s) circuit 206, based on, or as a function of, the statistic signal received from signal estimator circuit 202, the average statistic signal received from nominal statistic determination (calculation) circuit 204, one or more defined and/or definable threshold settings for each key statistic determined in relation of nominal statistics, and/or an additional generated clock signal (clk) value can output the activity detect signal that can ultimately be fed to low power control for LPM circuit 104.

In accordance with the foregoing and in one or more embodiments, activity detector circuit 102, for example, can determine and produce nominal (average) statistics from instantaneous statistics that in some aspects can correspond to activity and background noise, while in other aspects the instantaneous statistics can correspond solely to background noise. In one or more instances the nominal (average) statistics can be determined as a function of averaging the last N sample input signals ($V_{in}(t)$), where N is an integer greater than zero. In one or more alternative instances the nominal (average) statistics can be determined based on filtering across the last N sample input signals. In additional instances the nominal (average) statistics can be determined as a function of a median (or modal) calculation across the last N sample input signals. Activity detector circuit 102 based on the nominal (average) statistics can dynamically adjust one or more thresholds (e.g., activity thresholds) according to ambient noise that can be included in the input signal. Activity detector circuit 102 can indicate that activity is present in the input signal (e.g., generate and output an activity detect signal) when, for example, a determined statistic signal value generated by signal estimator circuit 202 is large in relation to nominal (average) statistics that can have been determined using the facilities and/or functionalities of nominal statistic determination (calculation) circuit 204 and/or activity detector based on key statistic(s) circuit 206 (e.g., activity or non ambient noise is detected in the input signal when a sound signature exceeds the ambient noise based on one or more defined/definable threshold values and/or one or more tunable threshold values). By providing indication of activity or non ambient noise based on a determination that an input signal comprises a sound signature that exceeds (or is distinguishable over) the level of ambient noise based on defined/definable threshold values and/or tunable threshold values, has been found to lead to good performance in the presence of varying ambient environments as the threshold values can be adaptively adjusted as the determined ambient averages change over time. Further, by dynamically adjusting the defined/definable threshold values and/or tunable threshold values low False Acceptance Ratios (FAR) and/or low False Rejection Ratios (FRR) can be achieved.

Figure 3:
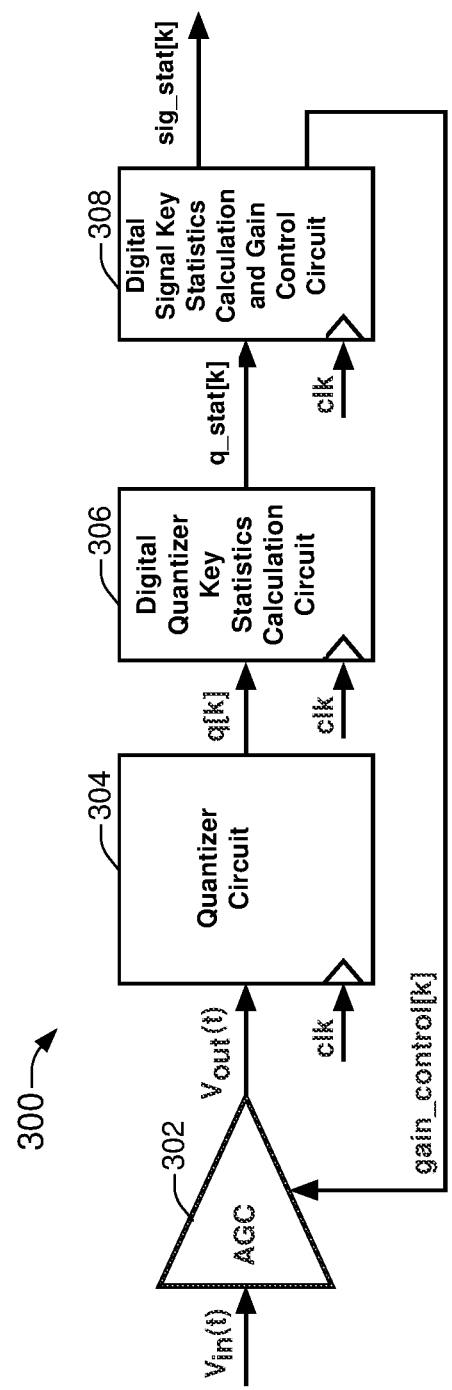
FIG. 3 illustrates additional aspects of an audio activity detector device/circuit in accordance with various embodiments set forth herein.

FIG. 3 provides further illustration 300 of signal estimator circuit 202 in accordance with one or more embodiments. As illustrated, signal estimator circuit 202 can comprise automatic gain control (AGC) circuit 302, quantizer circuit 304, digital quantizer key statistics calculation circuit 306, and digital signal key statistics calculation and gain control circuit 308. AGC circuit 302 can receive a signal input ($V_{in}(t)$) and a gain control signal (e.g., gain_control[k]) that can have been received from digital signal key statistics calculation and gain control circuit 308, and based on the signal input and/or the gain control signal can generate an output signal ($V_{out}(t)$). The output signal can be communicated to quantizer circuit 304 that, together with a clock signal, can be used by quantizer circuit 304 to generate a quantization output signal (e.g., q[k]). The quantization output signal can then be forward to digital quantizer key statistics calculation circuit 306. Digital quantizer key statistics calculation circuit 306 in response to receiving the quantization output signal from quantizer circuit 304, based at least on the quantization output and a clock signal (clk) value that can have been generated by a system clock (not shown), can determine and output a quantizer statistic signal (e.g., q_stat[k]) that can be communicated to digital signal key statistics calculation and gain control circuit 308.

Digital signal key statistics calculation and gain control circuit 308 on receiving the quantizer statistic signal and a further clock signal (clk) value can generate the statistic signal (e.g., sig_stat[k]) that can then be communicated to nominal statistic determination (calculation) circuit 204 and/or activity detector based on key statistic(s) circuit 206. Additionally, digital signal key statistics calculation and gain control circuit 308, as a function of the quantizer statistic signal and the clock signal, can generate a gain control signal (e.g., gain_control[k]) that can be fed back to AGC circuit 302.

In accordance with one or more embodiments, signal estimator circuit 202 can leverage AGC circuit 302 to widen dynamic ranges and/or maintain appropriate signal ranges for the quantizer circuit 304 by adjusting gain so that quantizer circuit 304 is not overly saturating and at least one or more levels of quantizer circuit 304 are activated. The quantizer circuit 304 can be a multi-bit quantizer circuit. In certain embodiments quantizer circuit 304 can be a two bit quantizer circuit. In one or more disparate embodiments quantizer circuit 304 can be at least a three bit quantizer circuit. In additional and/or alternative embodiments, quantizer circuit 304 can be a four bit quantizer circuit. Generally, AGC circuit 302 should be leveraged to ensure that the signal range of the output signal (e.g., $V_{out}(t)$) into quantizer circuit 304 avoids saturating quantizer circuit 304 while obtaining reasonable nominal (average) statistics to determine and distinguish meaningful acoustic activity from ambient background noise.

In regard to the gain control signal that can be fed back to AGC circuit 302 from digital signal key statistics calculation and gain control circuit 308, this gain control signal can leverage Delta-Sigma dithering to achieve higher effective resolutions. Key statistics that can be determined by signal estimator circuit 202 can include raw input signals (e.g., $V_{in}(t)$), RMS determinations, standard deviation determinations, peak-to-peak determinations, instantaneous amplitude determinations, and the like. For example, a statistic signal estimate can be determined based, for example, on a quantizer RMS estimate and a gain control value. Further, the statistic calculation can be selected across an appropriate time frame according to application requirements such as response times, etc. The statistic calculation can also be adaptively adjusted according to different ambient sound environments, and the statistic signal (e.g., sig_stat[k]) can be proportional to the quantizer statistic signal determined by digital quantizer key statistics calculation circuit 306 but inversely proportional to the gain control signal setting (e.g., larger gain settings imply that the input signal is smaller). Typically, the statistic calculation should accommodate any transient effects that occur when changing the gain setting.

Figure 4:
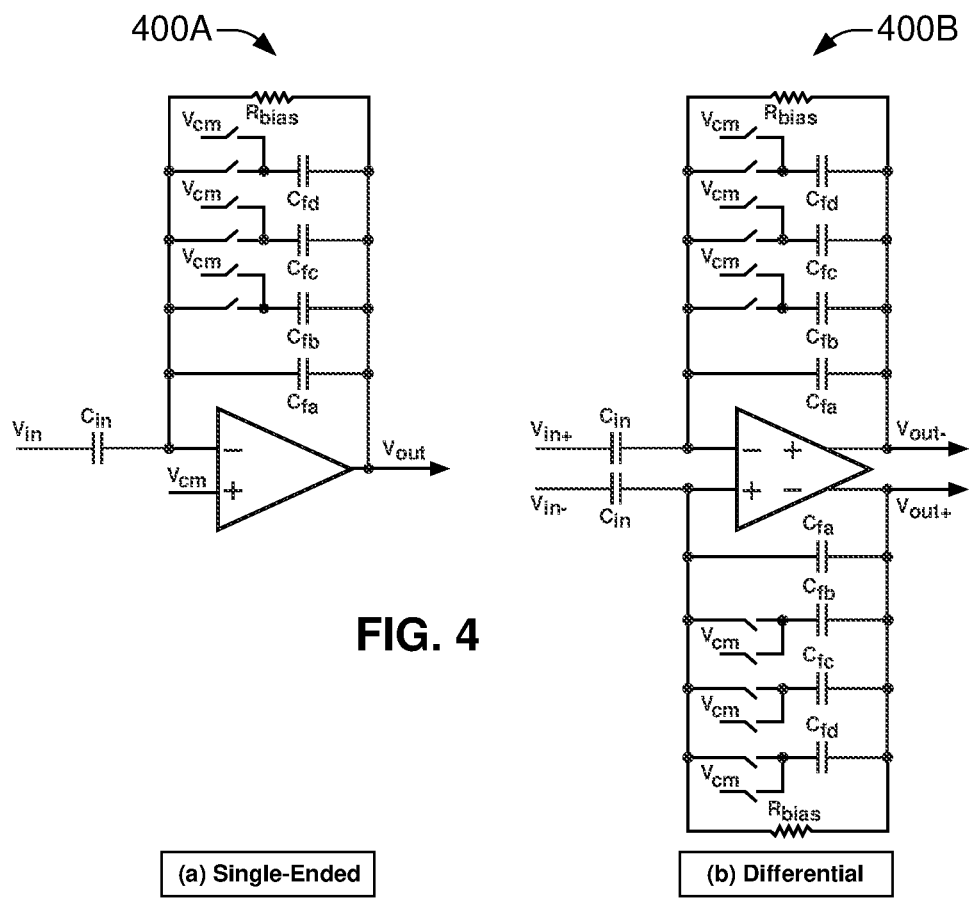
FIG. 4 illustrates further aspects of an audio activity detector device/circuit in accordance with various embodiments set forth herein.

FIG. 4 provides illustration of example automatic gain control circuits 400A (single ended) and 400B (differential) that can be utilized in accordance with one or more embodiments set forth in this disclosure. As depicted, the AGC circuits can be capacitor based since capacitors typically do not consume static power. Additionally, automatic gain control circuit 400B depicts an AC coupling that can be of benefit since DC signals can be ignored for audio signals thus allowing optimal DC bias for quantizer input (e.g. to maximize quantizer utilization). There can be implementation tradeoffs with the use of single ended automatic gain control circuit 400A and differential automatic gain control circuit 400B. For instance, use of differential automatic gain control circuit 400B can have better power supply rejection, whereas use of single ended automatic gain control circuit 400A is likely to offer low power consumption. As has been noted earlier, higher resolutions can be achieved by using dithering such as Delta-Sigma dithering.

Figure 5:
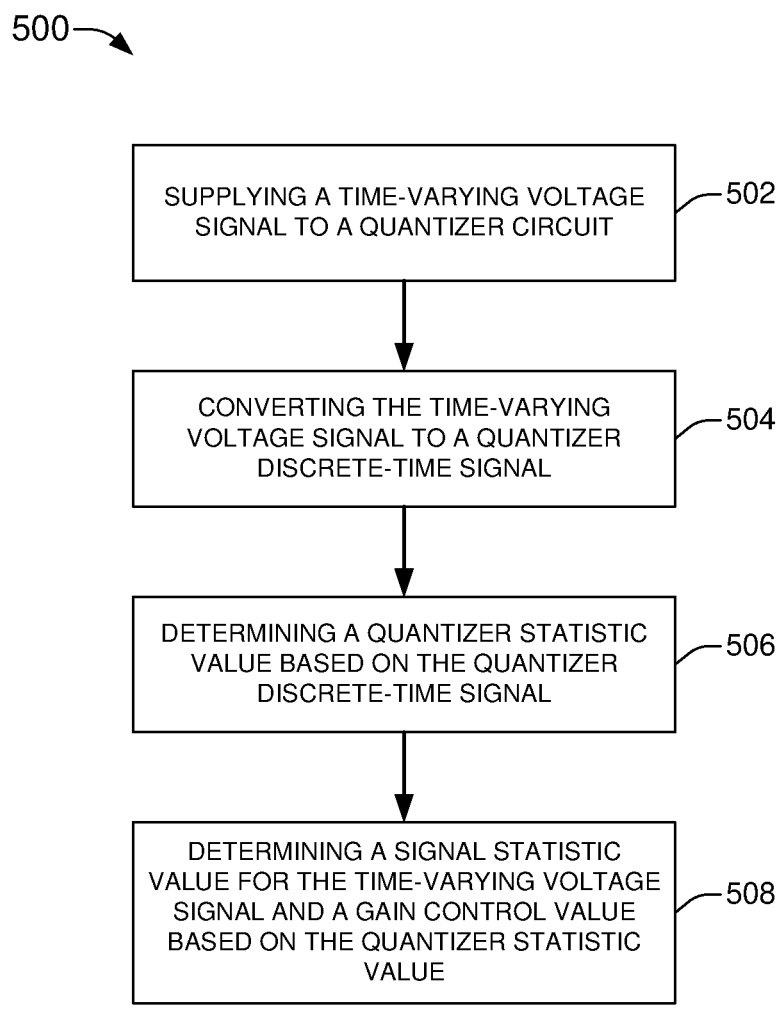
FIG. 5 illustrates a high-level example, non-limiting method for a low power always-on microphone that uses power reduction techniques, in accordance with one or more embodiments described herein.

FIG. 5 illustrates a method 500 for a low power always-on microphone that uses the disclosed power reduction techniques, in accordance with one or more embodiments described herein. As illustrated method 500 can commence at act 502 wherein a time-varying voltage signal can be supplied to a quantizer circuit. At act 504 the time-varying voltage signal can be converted to a quantizer discrete-time signal. At act 506 the quantizer discrete-time signal can be used to determine a quantizer statistic value. At act 508 a signal statistic value for the time-varying voltage signal and a gain control value can be determined based on the quantizer statistic value.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. In addition, the word "coupled" is used herein to mean direct or indirect electrical or mechanical coupling. In addition, the words "example" and/or "exemplary" are used herein to mean serving as an example, instance, or illustration. Any aspect or design described herein as "example" and/or "exemplary" is not necessarily to be construed as preferred or advantageous over other aspects or designs. Rather, use of the word exemplary is intended to present concepts in a concrete fashion.

What has been described above includes examples of the subject disclosure. It is, of course, not possible to describe every conceivable combination of components or methodologies for purposes of describing the subject matter, but it is to be appreciated that many further combinations and permutations of the subject disclosure are possible. Accordingly, the claimed subject matter is intended to embrace all such alterations, modifications, and variations that fall within the spirit and scope of the appended claims.

In particular and in regard to the various functions performed by the above-described components, devices, systems and the like, the terms (including reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter.

The aforementioned systems have been described with respect to interaction between several components. It can be appreciated that such systems and/or components can include those components or specified subcomponents, some of the specified components or subcomponents, and/or additional components, and according to various permutations and combinations of the foregoing. Subcomponents can also be implemented as components communicatively coupled to other components rather than included within parent components (hierarchical). Additionally, it should be noted that one or more components may be combined into a single component providing aggregate functionality or divided into several separate subcomponents, and any one or more middle layers, may be provided to communicatively couple to such subcomponents in order to provide integrated functionality. Any component described herein may also interact with one or more other components not specifically described herein.

In addition, while a particular feature of the subject disclosure may have been disclosed with respect to only one of the several implementations, such feature may be combined with one or more other features of the other implementations as may be desired and advantageous for any given or particular application. Furthermore, to the extent that the terms "includes," "including," "has," "contains," or variants thereof, and other similar words are used in either the detailed description or the claims, these terms are intended to be inclusive in a manner similar to the term "comprising" as an open transition word without precluding any additional or other elements.

What is claimed is:

1. A device comprising:
an electronic circuit that facilitates performance of operations, comprising:
receiving, via a sensor device, an input signal representing an audio event;
determining, as a function of an adaptable audio signal statistic representative of a root mean square signal energy value, that the audio event represents non-ambient audio activity; and
minimizing a supply voltage to the sensor device and transitioning the sensor device from a first state to a second state as a function of the non-ambient audio activity.

2. The device of claim 1, wherein first state represents a low power state.

3. The device of claim 1, wherein the second state represents a high power state.

4. The device of claim 1, wherein a first power usage by the sensor device in the first state is less than a second power usage by the sensor device in the second state.

5. The device of claim 1, wherein the operations further comprise in response to transitioning the sensor device to the second state, increasing a clock frequency value associated with the sensor device.

6. The device of claim 1, wherein the operations further comprise in response to transitioning the sensor device from the second state to the first state, decreasing a clock frequency value associated with the sensor device.

7. The device of claim 1, wherein the operations further comprise based on the sensor device being in the first state and in response to receiving the input signal, the sensor device generates an output signal that indicates a lack of audio activity.

8. The device of claim 1, wherein the operations further comprise based on the sensor device being in the second state and in response to receiving the input signal, the sensor device generates an output signal that is an accurate representation of the input signal.

9. An apparatus, comprising:
an electronic circuit that facilitates performance of operations, comprising:
receiving, via a microphone sensor device, an input audio signal;
based on the input audio signal, determining a root mean square signal energy value associated with the input audio signal;
determining, as a function of the root mean square signal energy value, that the input audio signal represents non-ambient audio activity; and
in response to determining the non-ambient audio activity, minimizing a bias current supplied to the microphone device and transitioning the microphone sensor device from a first state to a second state.

10. The apparatus of claim 9, wherein the root mean square signal energy value is a first root mean square signal energy value, and wherein the operations further comprise based on the input audio signal, determining a second root mean square signal energy value associated with the input audio signal.

11. The apparatus of claim 10, wherein the second root mean square signal energy value indicates that the input audio signal represents ambient audio activity.

12. The apparatus of claim 11, wherein the operations further comprise determining that the first root mean square signal energy value is greater than a threshold value.

13. The apparatus of claim 12, wherein the operations further comprise determining that the second root mean square signal energy value is less than the threshold value.

14. The apparatus of claim 13, wherein the threshold value represents an adjustable value that minimizes a value associated with a determined false acceptance ratio.

15. The apparatus of claim 13, wherein the threshold value represents an adjustable value that minimizes a value associated with a determined false rejection ratio.

16. The apparatus of claim 9, wherein the operations further comprise determining, based on the root mean square signal energy value, that the input audio signal represents ambient audio activity.

17. The apparatus of claim 16, wherein the operations further comprise in response to determining the ambient audio activity, transitioning the microphone sensor device from the second state to the first state.

18. The apparatus of claim 9, wherein the first state represents a low power state and the second state represents a high power state.

* * * * *